United States Patent [19]

Schwegman

[11] Patent Number: 5,276,450
[45] Date of Patent: Jan. 4, 1994

[54] PHASE COHERENT HETERODYNE ANTI-JAM METHOD AND APPARATUS

[75] Inventor: Charles W. Schwegman, Kettering, Ohio

[73] Assignee: Systems Research Laboratories, Inc., Dayton, Ohio

[21] Appl. No.: 246,509

[22] Filed: Mar. 23, 1981

[51] Int. Cl.$^5$ .............................................. G01S 7/36
[52] U.S. Cl. ......................................... 342/16; 455/1
[58] Field of Search .............. 343/18; 455/1; 342/16, 342/17

[56] References Cited

U.S. PATENT DOCUMENTS

| | | | |
|---|---|---|---|
| 3,806,925 | 4/1974 | Cuthbert | 343/18 E |
| 3,943,515 | 3/1976 | Miley | 343/18 E |
| 3,949,309 | 4/1976 | Pecar | 343/18 E X |
| 3,981,013 | 9/1976 | Christensen | 343/18 E X |
| 4,170,009 | 10/1979 | Hamer | 343/18 E |
| 4,215,344 | 7/1980 | Phillips, Jr. | 343/18 E |

Primary Examiner—T. H. Tubbesing
Attorney, Agent, or Firm—Biebel & French

[57] ABSTRACT

Method and apparatus for reducing the effects of noise jamming on coherent frequency or phase modulated signals employs a two channel radio signal processing system (15, 20) which accepts an input signal containing a desired signal (S) and a jamming signal (J) from a receiver input circuit (10). In the first channel (15), a hetrodyne mixer (30) and wideband filter (35) select the difference frequency component between the jamming signal and the desired signal [X(t)] while in the second channel (20), a local oscillator (45), mixer (50) and filter (55) function to select the difference frequency between the jamming signal and the local oscillator [Y(t)]. A third mixer (90) and bandpass filter (95) combines the outputs X(t) and Y(t) to provide the desired signal, including its original phase and frequency modulation components substantially independent and free of the jamming signal, to the receiver output circuit (12).

6 Claims, 3 Drawing Sheets

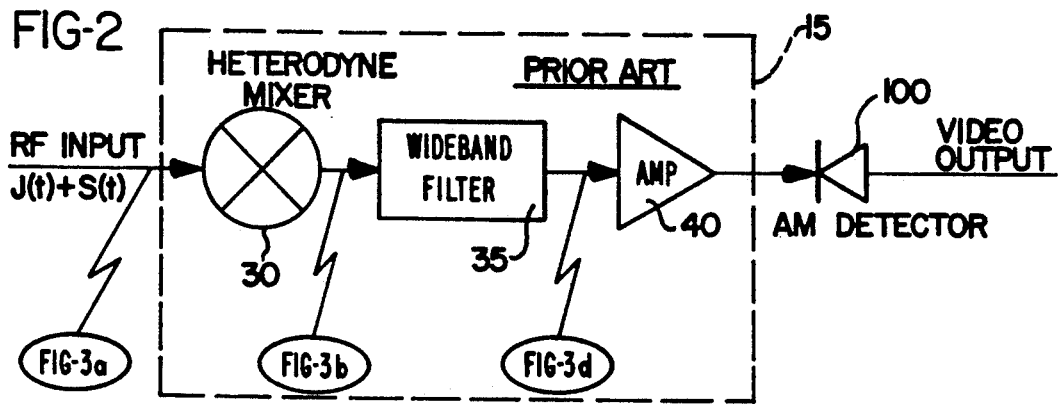
FIG-2
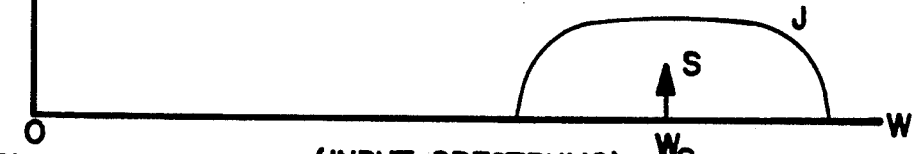
FIG-3a (INPUT SPECTRUMS)
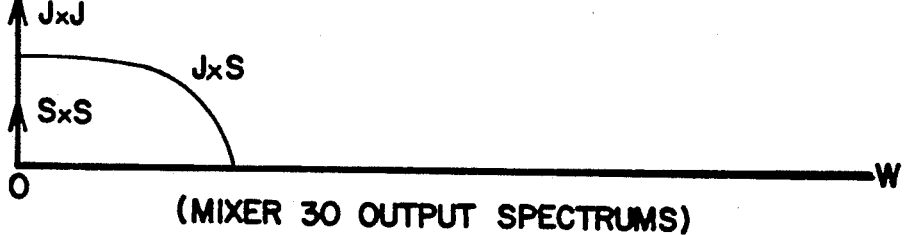
FIG-3b (MIXER 30 OUTPUT SPECTRUMS)
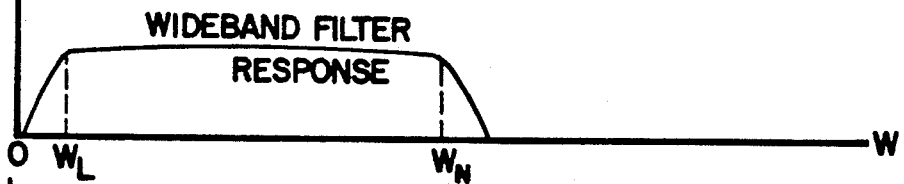
FIG-3c (FILTER 35 RESPONSE)
FIG-3d (OUTPUT OF FILTER 35)

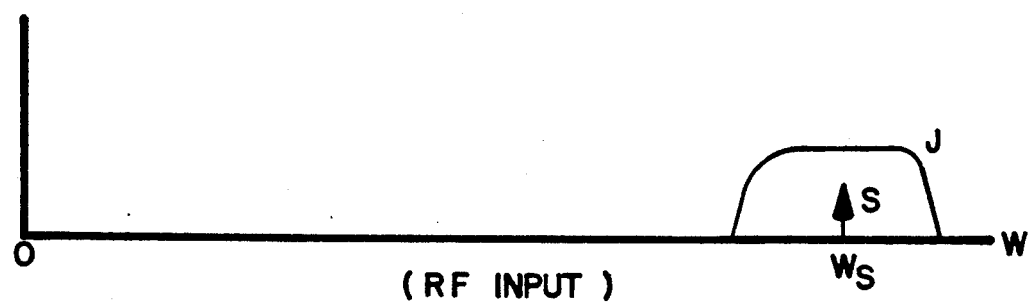
FIG-4a (RF INPUT)
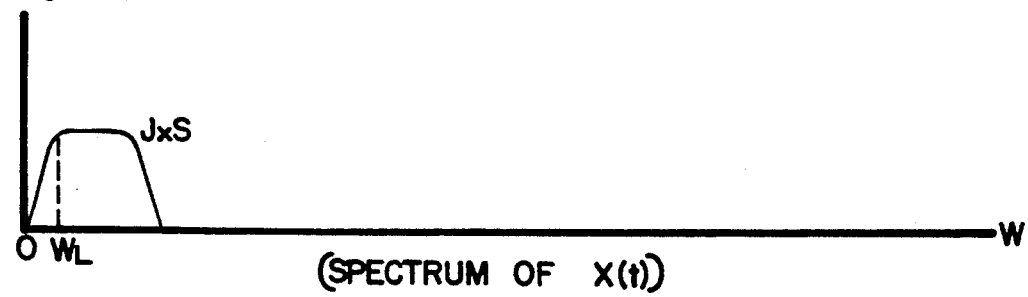
FIG-4b (SPECTRUM OF X(t))
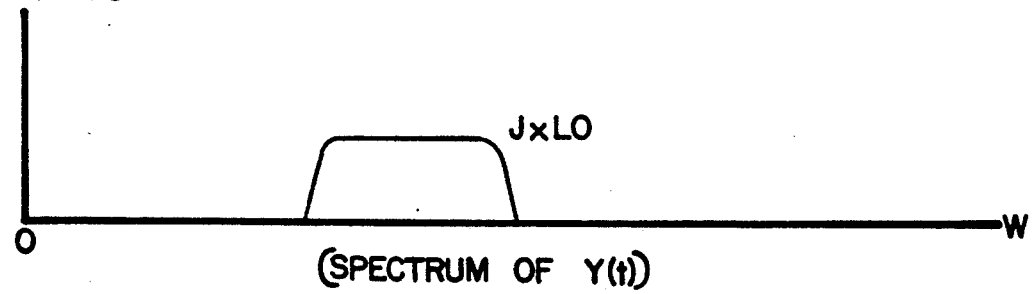
FIG-4c (SPECTRUM OF Y(t))
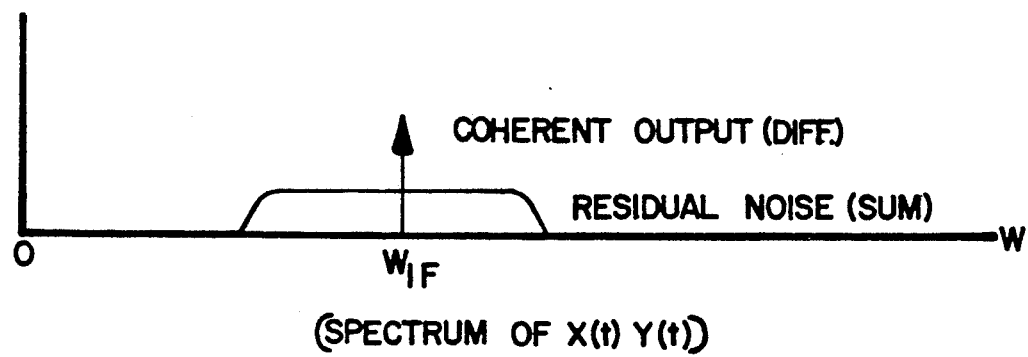
FIG-4d (SPECTRUM OF X(t) Y(t))

PHASE COHERENT HETERODYNE ANTI-JAM METHOD AND APPARATUS

BACKGROUND OF THE INVENTION

This invention relates to a method and apparatus for reducing or eliminating the effects of noise jamming on coherent radar systems and frequency/phase modulated communication receivers. The invention both enhances the detection of a weak signal in the presence of strong noise jamming, and allows recovery of any frequency and/or phase modulation on the signal. Signal detection is enhanced by a heterodyning or nonlinear processing technique; however, other circuitry is also employed to preserve the frequently and phase information carried by the signal.

Modern coherent radar and communications receivers perform an accurate measurement of signal phase or frequency, and they require that any transmitted phase/frequency modulation be preserved and recoverable in the receiver. For example, in a pulse doppler radar, the target return pulse must be coherent with the transmitted pulse so that the doppler frequency shift of the return signal can be measured. The doppler measurement gives an indication of the target velocity and allows a target to be separated from ground clutter on the basis of differential doppler shifts.

Another example of a coherent type system is a pulse compression radar which transmits a frequency modulated (e.g., FM chirp) or phase-coded RF pulse. The received pulse is decoded and compressed in the receiver by a filter matched to the pulse characteristics. The result of the matched filter/pulse compression processing is improved radar sensitivity and range resolution. Unless the transmitted frequency or phase modulation is preserved on the received signal, the benefits of pulse compression are not realized.

Many modern communication systems use phase shift keying (PSK) and frequency shift keying (FSK) modulation formats. Thus, phase or frequency discrimination is inherent in demodulating the received signal and recovering the data. PSK AND FSK techniques are applied in both direct data transmission systems and spread spectrum systems. In a spread spectrum communication system, the signal spectrum is spread over a wide bandwidth by superimposing a wide bandwidth code on the digital data stream. The spread spectrum receiver collapses the wide signal bandwidth to the data bandwidth by stripping off the code and, as a result of this processing, an improvement in signal-to-noise ratio is achieved. Again, the modulation on the received signal must be undisturbed for the spectrum despreading processing to be effective. Therefore, it is essential that any anti-jam signal processing technique applied to the above systems must preserve the signal phase/frequency information.

Noise jamming from hostile or friendly sources poses a significant threat to coherent radars and communication receivers. A commonly used jamming technique is FM-noise in which an RF carrier is frequency modulated by a baseband noise signal. Spot FM-noise signals with RF bandwidths from 1 MHz to 50 MHz and barrage noise signals with bandwidths from 50 MHz to several hundred MHz are typically used. In some cases noise amplitude modulation may also be intentionally or unintentionally induced on the FM-noise signal.

The effect of noise jamming on coherent systems is to obscure the received signal to the extent that it cannot be detected or demodulated in the receiver. Against a pulse doppler radar system, this jamming can effectively deny target detection, ranging, and doppler frequency measurement. Pulse compression type radars have some inherent protection against noise jamming, but with sufficient power a noise jammer can still effectively mask the radar return, thus prohibiting target detection and ranging. In FSK or PSK communication systems, noise jamming effectively increases the receiver noise level so that the detection sensitivity suffers and the bit error rate or distortion level increases.

In the past, heterodyning or nonlinear processing techniques have been used for suppressing jammer interference in receivers. There are some variations in the techniques, but the basis of all of them is that the jammer is heterodyned or mixed with the desired signal to generate a jammer-signal difference of "beat" frequency signal. This beat frequency component, which has the envelope characteristics of the desired signal, is further processed or demodulated and used as a substitute for the normal receiver output. The heterodyning is performed by a mixer or nonlinear device in which the jamming functions as the mixer local oscillator (LO) signal. With proper filtering of the mixer output signal, an improvement in signal-to-jammer power ratio is obtained.

The fundamental limitation of these techniques is that the frequency/phase information or "coherence" of the signal is destroyed in the heterodyning process. Since the signal is mixed with the jammer, the difference frequency signal has the frequency or spectral characteristics similar to the jammer. Only the signal envelope and timing information is recoverable with these techniques.

Various heterodyne anti-jam techniques have been devised. These include the Counter-Countermeasure Guidance System described in U.S. Pat. No. 3,943,515 and the Radar Device Using Heterodyning Without a Local Oscillator described in copending application Ser. No. 690,423. These particular devices are noncoherent and are not readily applicable to a phase or frequency modulated system.

Another patented approach, described in U.S. Pat. No. 3,949,309, uses a jammer heterodyning technique that preserves the spectral characteristics of a received communication signal. However, the technique is only effective against unmodulated or slowly varying CW jamming and relies on the ability of the receiver to phase-lock an oscillator to the jamming signal. Phase-locking to the jammer is not practical in most cases, especially when the jammer is noise modulated or broadband. Also, narrowband CW jamming is seldom used against radars because of the difficulty involved in setting a narrowband jammer on the radar frequency.

In the present invention, the basic heterodyning anti-jam technique is retained while the frequency/phase modulation on the desired signal is preserved. Herein lies the advantage of this invention over prior art. This capability makes the invention applicable as an anti-jam device for CW and pulse doppler radars, pulse compression radars, frequency/phase modulated communication systems, and radar warning receivers that use frequency discrimination.

BRIEF DESCRIPTION OF INVENTION

The invention utilizes a two channel radio frequency signal processing system using RF combiners, mixers, and filters. In the first channel, a Jammer signal (J) and the desired signal (S) are mixed to produce cross product (J×S). In the second channel, the Jammer is mixed with a local oscillator (LO) signal from the radar, communication receiver, or other source. The primary output of the second channel mixer is a jammer-LO cross-product (J×LO) signal.

After filtering both mixer outputs to remove sum frequency and other undesired components, the two channel signals are mixed (or multiplied) with each other. This mixing operation generates a signal component of the form S×LO. The S×LO component is equivalent to the output of a conventional superheterodyne mixing scheme in which the receiver LO is mixed with the signal.

Thus, the result of multiplying the two channel cross products, J×S and J×LO, is to reconstruct the spectral characteristics of the signal (S), shifted in frequency by the frequency of the local oscillator. In this process any frequency or phase modulation on the received signal is reconstituted, and the anti-jam protection available in the heterodyne operation in the first channel is still realized.

It is therefor an object of this invention to provide an improved radio frequency signal processing system including means for applying a radio frequency input signal containing a desired signal and a jamming signal to a pair of signal processing circuits; a first signal processing circuit including: first mixer means for mixing the components of the input signal to produce a first composite signal, and filter means for selecting from said first composite signal the difference frequency component between the jamming signal and the desired signal; a second signal processing circuit including: a local oscillator, second mixer means for mixing the input signal with the output of said local oscillator to produce a second composite signal, and filter means for selecting from said second composite signal the difference frequency component between the jamming signal and said local oscillator output; and third mixer means for combining the outputs of said first and said second signal processing circuits to provide a radio frequency output signal containing the desired signal including its original phase and frequency modulation components, shifted in frequency by the frequency of said local oscillator, and being substantially independent of said jamming signal.

These and other objects of the invention will be apparent from the following description, the accompanying drawings and the appended claims.

BRIEF DESCRIPTION OF THE DRAWINGS

FIG. 2 is an electrical blocked diagram illustrating a prior art, non-coherent heterodyne detector.

FIGS. 3A through 3D are waveform diagrams illustrating the operation of the apparatus of FIG. 2.

FIGS. 4A through 4D are waveform diagrams illustrating the operation of the apparatus shown in FIG. 1.

DESCRIPTION OF THE PREFERRED EMBODIMENT

Figure 1:
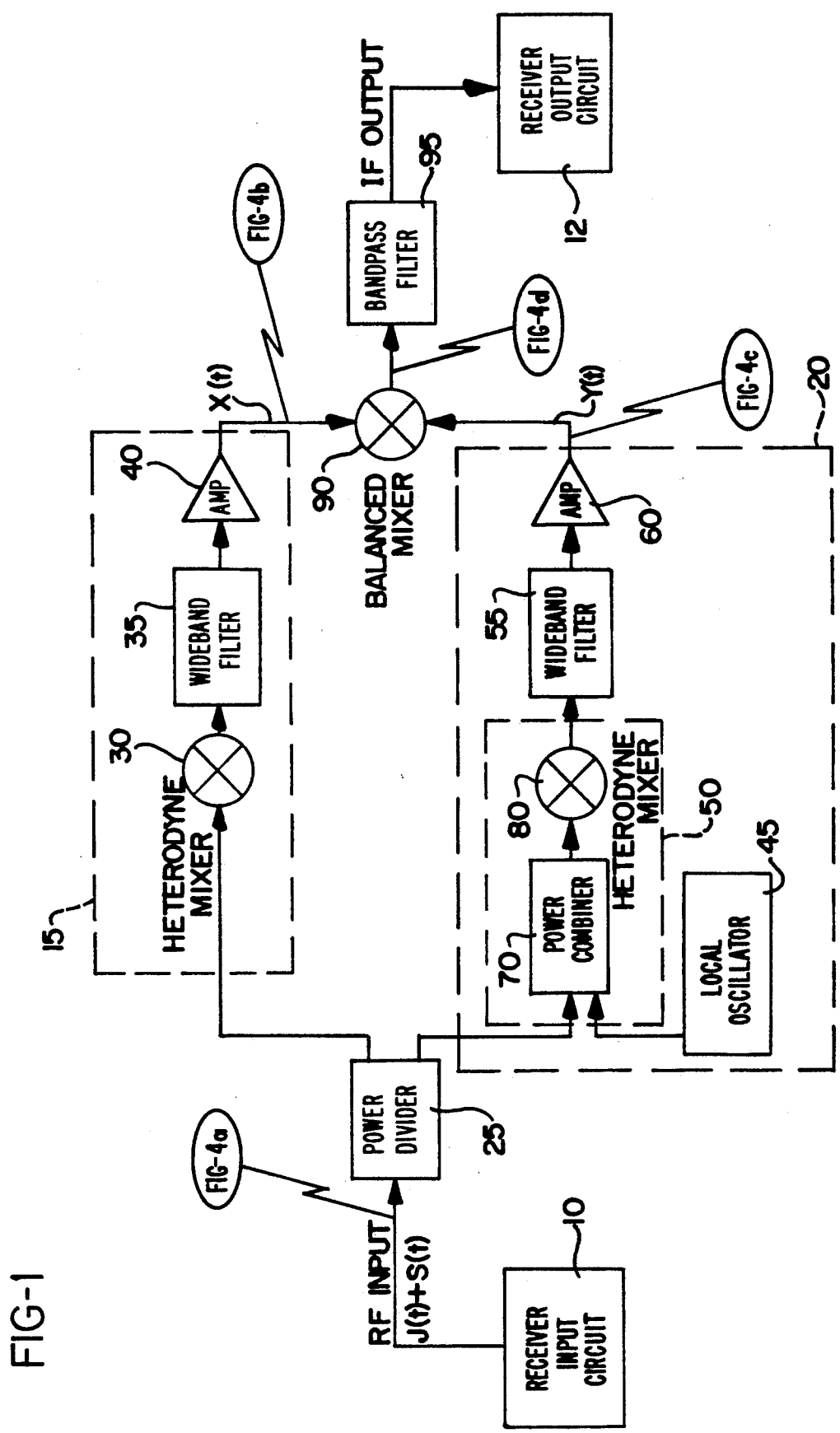
FIG. 1 is an electrical blocked diagram illustrating a preferred embodiment of the invention.

Referring now to the drawings and particularly to the block diagram of FIG. 1 which illustrates the preferred embodiment of the invention, a radio frequency signal processing circuit is generally connected between a receiver input circuit 10 and a receiver output circuit 12. The signal from the receiver input circuit 10, comprising an input signal containing a desired signal (S) and a jamming signal (J) is applied to a pair of signal processing circuits 15 and 20 by means of a power divider circuit 25.

The first signal processing circuit 15 includes a heterodyne mixer 30 for mixing the components of the input signal to produce a first composite signal. This composite signal is applied to a wideband, bandpass filter 35 which selects from the composite signal the difference frequency component between the jamming signal and the desired signal. The output of the filter 35 is then amplified by radio frequency amplifier circuit 40.

The second signal processing circuit 20 includes a local oscillator 45, a second mixer circuit 50 (including power combiner 70 and mixer 80) for mixing the input signal with the output of the local oscillator to produce a second composite signal, a wideband, bandpass filter 55 for selecting from the composite signal the difference frequency component between the jamming signal and the local oscillator frequency, and a radio frequency amplifier 60.

The outputs of the amplifiers 40 and 60 are applied to a balanced mixer 90 which combines the outputs of the first signal processing circuit 15 and the second signal processing circuit 20 to provide a radio frequency output containing the desired signal having its original phase and frequency modulation components included, but shifted in frequency by the frequency of the local oscillator, and being substantially independent of the jamming signal.

The operation of the invention can best be explained in terms of a time domain mathematical analysis. The mathematical basis for both the non-coherent and coherent heterodyne techniques is presented in the following paragraphs. The non-coherent technique is considered to be prior art; however, an analysis of it is thought to be essential to understanding the phase coherent technique.

The noncoherent technique uses a mixer 30 wideband filter 35, amplifier 40 and amplitude modulated (AM) detector 100 in the configuration shown in FIG. 2. The basis of the technique is to allow the strong Jamming signal to act as the mixer local oscillator (LO) so as to generate a jammer/signal beat frequency. The heterodyne mixer 30 is equivalent to any nonlinear device that generates the square of the input signal.

If the input is J(t)+S(t) (jammer plus signal), the output is equal to $[J(t)+S(t)]^2$. This squared term contains three products: J×J, S×S, and J×S. The J×S product represents the desired output component which is passed through the wideband filter/amplifier 35,40 and is AM detected. The undesired terms, J×J and S×S, are eliminated or suppressed by the wideband filter Since J×S is the desired signal and J×J is the dominant noise term, the signal-to-noise (S/J) ratio at the filter output is effectively improved over the input S/J. The detected video has the envelope characteristics of the input S(t); and thus, can be used as a substitute for the normal video in a pulsed radar or AM communication receiver that is disrupted by the jamming noise.

If the jammer is frequency modulated (FM) noise, it can be represented mathematically by the expression $$J(t) = A \cos[W_j t + F(t)]$$

where $W_J$ is the jammer center frequency, $F(t)$ is the FM noise, and A is the amplitude. For simplicity, the signal is assumed to be CW sine wave given by $$S(t) = B \cos W_S t$$

The resulting mixer output terms, assuming the sum frequency components are removed by the wideband filter, are as follows:

$$S \times S = B^2/2$$

$$J \times J = A^2/2$$

$$J \times S = AB \cos[(W_J - W_S)t + F(t)]$$

Note that the $S \times S$ and $J \times J$ terms are direct current (DC). The FM noise term $F(t)$ is completely cancelled in the $J \times J$ term, leaving the unmodulated DC component. The $J \times S$ term has the spectral characteristics of the jammer translated to a center frequency of $W_J - W_S$, which is normally close to DC. The wideband filter 35 has a bandpass response with a lower cutoff frequency of $W_L$. It removes the dc components $J \times J$ and $S \times S$ and passes the spectrum of $J \times S$ that falls above $W_L$. If $W_L$ is small compared to one-half the jammer bandwidth, then the desired $J \times S$ term is not significantly affected by the filtering.

The pertinent signal spectrums are illustrated in FIG. 3. FIG. 3A shows the input signal (S) and jammer (J) spectrums and FIG. 3B shows the difference frequency spectrums generated in the heterodyne mixer. The bandwidth of a typical noise jammer for countering a radar or wideband communication channel will range from 5 MHz to several hundred megahertz. With a narrowband communication system, the jammer bandwidths encountered are likely to be much less and will depend on the bandwidth of the system.

In each application, the filter cutoff $W_L$ may be chosen such that most of the $J \times S$ energy is passed and detected. FIG. 3c shows a typical filter response and FIG. 3d illustrates its effect on the $J \times S$ Spectrum. In a radar application, $W_L$ would normally be in the range of 1–5 MHz. The upper cutoff frequency $W_N$ is selected to pass the greatest expected jammer/signal instantaneous differency frequency (typically up to several hundred megahertz), but low enough to reject the $2W_S$ and $2W_J$ components also generated in the mixer.

If AM-noise is also present on the jammer, the basic heterodyne technique is still valid. AM noise may be induced intentionally or unintentionally on the jammer along with the FM noise. A jammer with both AM and FM noise may be represented by the expression $$J(t) = [A + a(t)] \cos[W_J t + F(t)]$$

where $a(t)$ is the AM noise modulating signal. With AM noise present, the $J \times J$ mixer output term is equal to $$J \times J = \frac{[A + a(t)]^2}{2}$$

which contains DC plus baseband noise components. The noise bandwidth of $J \times J$ is a function of the $a(t)$ bandwidth, which may range from several kilohertz up to 5–6 megahertz in typical jammers. This AM noise is suppressed by the wideband filter. The amount of suppression is in proportion to the ratio of $W_L$ to the bandwidth of $[1 + a(t)]^2$.

In many practical cases, $W_L$ may be selected to reject a large portion of this noise while passing most of the desired $J \times S$ component. With many common noise jammers, the $J \times S$ bandwidth will be much greater than the $[1 + a(t)]^2$ bandwidth. Thus, a significant improvement improvement in S/J is still obtainable against an FM/AM jammer.

By the nature of the heterodyne technique, it is a noncoherent process since the desired output term $J \times S$ contains the jammer frequency modulation. Any phase/frequency information on S(t) is destroyed in the nonlinear processing. The intent of this invention is to recover the phase/frequency information through some additional signal processing.

Referring again to FIG. 1, the phase coherent configuration has two heterodyne channels 15 and 20 each with a mixer, wideband filter, and amplifier. In the circuit 20, channel 2, a local oscillator (LO) signal from the associated radar or communication receiver is injected into the mixer 50 input at a high level. Assuming that J(t) is stronger than S(t), the dominant output from the mixer is the $J \times LO$ product.

Since the LO frequency is normally offset from the input RF by some intermediate frequency (IF), the $J \times LO$ spectrum is centered at $$W_J - W_{LO} = W_{IF}$$

The expression for the $J \times LO$ product, excluding the sum frequencies, is equal to $$Y(t) = A \cos[(W_J - W_{LO})t + F(t)].$$

By multiplying Y(t) ($J \times LO$) in channel 2 with X(t) ($J \times S$) in channel 1, the phase modulation on the input signal is restored. The multiplication is accomplished by applying Y(t) to the LO port and X(t) to the IF port of a conventional double balanced mixer 90. The resulting RF output, whose frequency is centered at $W_{IF}$, is bandpass filtered to a bandwidth equivalent to the S(t) bandwidth. In mixing X(t) and Y(t), both sum and difference frequencies are generated which fall in the intermediate frequency (IF) passband. Given that $$X(t) = \frac{AB}{2} \cos[(W_J - W_S)t + F(t)]$$

$$Y(t) = \frac{A}{2} \cos[(W_J - W_{LO})t + F(t)]$$

then the product of X(t) and Y(t) is equal to $$X(t)\,Y(t) = \frac{A^2 B}{4} \cos(W_S - W_{LO})t +$$

$$\frac{A^2 B}{4} \cos[(2W_J - W_S - W_{LO})t + 2F(t)]$$

which consists of two equal amplitude signal terms corresponding to the sum and difference frequency components of the product X(t)Y(t). One term is the phase coherent output, and the other is a residual noise term.

Note that the first term is simply the input signal translated in frequency by the LO frequency. This is identical to the IF output of a normal superheterodyne receiver with an IF of $W_S - W_{LO}$. Therefore, the first term is coherent with the input S(t), and any phase/frequency modulation on S(t) appears on this signal. The jammer frequency modulation on the J×S and J×LO signals is effectively cancelled in the multiplication process.

Although the second term is equal in amplitude, its energy is spread over a bandwidth equal to twice the jammer bandwidth. Other products are present in the mixer output, but they are small in comparison to the coherent output [as long as J(t)>S(t)]. If the signal is not a simple sine wave, but has some bandwidth due to phase or frequency modulation, the technique is still valid. The processing reconstructs the signal spectrum and shifts it in frequency from the input RF to the IF.

To illustrate the signal spectral relationships, the frequency spectrums of the input, X(t), Y(t), and X(t) Y(t) are shown in FIG. 4. Comparing FIGS. 4a and 4d shows the net effect of the coherent heterodyne processing. The processing equalizes the jammer (residual noise) and signal power levels. Whereas, the input jammer power greatly exceeds the signal, the output jammer power is roughly equal to the signal with the jammer power diluted over twice the jammer bandwidth. With this J/S improvement applied to the front end of a receiver, the detection capability in a jamming environment can be greatly enhanced. Pulse doppler radars using narrowband processing, pulse compression radars, and spread spectrum communication receivers can easily detect signals when the jammer and signal strength are roughly equal.

The invention, as shown in FIG. 1, is implemented using standard RF signal processing components, with the exception of the heterodyne mixers 30 and 80. These mixers may be nonlinear devices such as simple diodes. The device must operate over the input RF band of the receiver and must provide an output bandwidth equal to the maximum expected jammer bandwidth (up to several hundred megahertz).

The bandwidth required in the filters 35, 55, and amplifiers 40, 60 depend on the primary jamming threats to the system. For example, in a radar application, the noise jamming threat may have an RF bandwidth of between 10 MHz and 200 MHz. If the baseband noise modulating signal used by the jammer has a bandwidth of 4-5 MHz, then the lower limit ($W_L$) of filters 35 and 55 would be set to 4-5 MHz. The spectrum of any baseband noise generated in the mixers would be concentrated below 4-5 MHz, and thus the noise would be removed or greatly reduced by the filters. The upper cut-off frequency ($W_N$) of 35 would be set equal to the maximum jammer bandwidth, or about 200 MHz. In filter 55 $W_N$ would be set to 200 MHz plus the radar IF since the mixer 80 output is offset in frequency by the radar IF. Thus, if the radar IF is 60 MHz, $W_N$ for filter 55 should be about 260 MHz.

Similarly, an FM-noise communications jammer may have a bandwidth ranging from 50 kHz to 5 MHz that is generated by a baseband noise modulating signal with a bandwidth of about 10-20 kHz. In this case an $W_L$ of 20 khz and and $W_N$ of 5 MHz would be selected for filter 35. The $W_L$ of filter 55 would be 20 kHz, or higher; and $W_N$ would be made approximately equal to 5 MHz plus the IF of the communication receiver.

In same applications there may be several different noise jamming threats to a receiver system. In these cases filter 35 and 55 characteristics are chosen which offer the best possible performance against all the threats; or multiple selectable filters, optimized for each threat, are used and switched in accordingly when each threat is present.

While the method herein described, and the form of apparatus for carrying it into effect, constitute preferred embodiments of this invention, it is to be unerstood that the invention is not limited thereto, and that changes may be made therein without departing from the scope of the invention.

What is claimed is:

1. A radio frequency signal processing system including:

means for applying a radio frequency input signal containing a desired signal and a jamming signal to a pair of signal processing circuits, a first signal processing circuit including: first mixer means for mixing the components of the input signal to produce a first composite signal, and filter means for selecting from said first composite signal the difference frequency component between the jamming signal and the desired signal, a second signal processing circuit including: a local oscillator, second mixer means for mixing the input signal with the output of said local oscillator to produce a second composite signal, and filter means for selecting from said second composite signal the difference frequency component between the jamming signal and said local oscillator output, and third mixer means for combining the outputs of said first and said second signal processing circuits to provide a radio frequency output signal containing the desired signal including its original phase and frequency modulation components, shifted in frequency by the frequency of said local oscillator, and being substantially independent of said jamming signal.

2. The method in a radio receiver of separating a received desired radio frequency signal from a received wideband jamming signal and reconstituting any phase or frequency modulation on the said received desired signal, the said receiver having the received composite signal containing the components of the jamming signal and the desired signal, a local oscillator signal, and an intermediate frequency input to the following receiver circuits, the said method comprising the steps of:

a. heterodyning the jamming signal with the desired signal to provide a first cross product signal of the desired signal with the jamming signal;

b. heterodyning the received composite signal with the said local oscillator signal to provide a second cross product signal of the said jamming signal with the said local oscillator signal;

c. mixing the said first cross product signal with the said second cross product signal to provide a third signal comprising the desired signal shifted in frequency by the said local oscillator frequency; and d. coupling the said third signal to the said intermediate frequency input of the said radio frequency receiver.

3. The improvement in a radio frequency receiver for detecting in a presence of a strong noise jamming signal a weak signal and preserving any frequency and/or phase modulation thereon, the said receiver having an input circuit providing a received radio frequency signal containing a desired signal combined with a stronger signal, a local oscillator signal, and an input to an intermediate frequency circuit of predetermined frequency and band width, the said improvement comprising, (a) means including a power divider cooperating with the said input circuit for dividing said received signal and providing a first channel and a second channel with each channel having substantially equal unaltered received signals;

(b) means including a power combiner, positioned in the said second channel, for injecting in summing relationship the said local oscillator signal with the said second channel received signal;

(c) means including a first wide band hetrodyne mixer positioned in said first channel for hetrodyning said received signal and providing a first product signal comprising substantially products involving the said jamming signal and the said desired signal;

(d) means including a second wide band hetrodyne mixer positioned in said second channel subsequent to and cooperating with the said power combiner, providing a second product signal comprising substantially products involving the said jamming signal and the said local oscillator signal;

(e) means including a first wide band filter positioned in said first channel subsequent to and cooperating with the said hetrodyne mixer for removing or reducing the direct current signal and baseband noise components, comprising substantially the squares of the desired signal and the jamming signal, and passing and providing a first filtered output signal comprising the cross product difference frequencies of the desired signal and the jamming signal;

(f) means including a second wide band filter positioned in second channel subsequent to and cooperating with the said second hetrodyne mixer for removing or reducing the direct current and baseband noise components, comprising substantially the squares of the jamming signal and the local oscillator signal, and passing and providing a second filtered output signal comprising the cross product difference frequencies of the said jamming signal and the said local oscillator signal;

(g) means including a first amplifier positioned in said first channel subsequent to and cooperating with the said first filter for providing a first amplified output signal;

(h) means including a second amplifier positioned in said second channel subsequent to and cooperating with the said second filter for providing a second amplified output signal;

(i) means including a balanced mixer cooperating with said first amplifier output signal and said second amplifier output signal for multiplying the cross product difference frequencies of the said first channel with the cross product difference frequencies of the said second channel and providing an output signal that contains the spectral characteristics of frequency and phase of said desired weak signal shifted in frequency by the said local oscillator signal; and (j) means for injecting the said output of the said balanced mixer into the said receiver intermediate frequency input.

4. The improved receiver as claimed in claim 3 wherein the said first hetrodyne mixer and the said second hetrodyne mixer are both diodes.

5. The improved receiver as claimed in claim 4 wherein the said balanced mixer is a double balanced mixer.

6. The improved receiver as claimed in claim 5 wherein the said means for injecting the said output of the balance mixer into the said intermediate frequency input includes a bandpass filter for limiting the output signal from the balanced mixer to the said predetermined frequency and band width of the receiver intermediate frequency circuit.

* * * * *